United States Patent
Shen et al.

(10) Patent No.: US 11,772,960 B2
(45) Date of Patent: Oct. 3, 2023

(54) METHOD OF FORMING DIELECTRIC AND METAL SEALING LAYERS ON CAPPING STRUCTURE OF A MEMS DEVICE

(71) Applicant: TAIWAN SEMICONDUCTOR MANUFACTURING COMPANY LTD., Hsinchu (TW)

(72) Inventors: Ching-Kai Shen, Hsinchu County (TW); Yi-Chuan Teng, Hsinchu County (TW); Wei-Chu Lin, Hsinchu (TW); Hung-Wei Liang, New Taipei (TW); Jung-Kuo Tu, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 194 days.

(21) Appl. No.: 17/209,098

(22) Filed: Mar. 22, 2021

(65) Prior Publication Data

US 2021/0206627 A1     Jul. 8, 2021

Related U.S. Application Data

(62) Division of application No. 16/426,575, filed on May 30, 2019, now Pat. No. 10,961,114.

(51) Int. Cl.
*B81B 7/00* (2006.01)
*B81C 1/00* (2006.01)

(52) U.S. Cl.
CPC ........ *B81B 7/0041* (2013.01); *B81C 1/00293* (2013.01); *B81B 2201/0235* (2013.01); *B81B 2201/0242* (2013.01); *B81B 2207/07* (2013.01); *B81C 2203/0145* (2013.01)

(58) Field of Classification Search
CPC .......... B81B 7/0041; B81B 2201/0235; B81B 2201/0242; B81B 2207/07; B81C 1/00293; B81C 2203/0145; B81C 1/00269
See application file for complete search history.

(56) References Cited

U.S. PATENT DOCUMENTS

| | | | |
|---|---|---|---|
| 7,659,150 B1 * | 2/2010 | Monadgemi | H01L 23/26 257/E23.193 |
| 2004/0224091 A1 * | 11/2004 | Rusu | B81C 1/00293 427/350 |
| 2005/0095833 A1 * | 5/2005 | Lutz | B82Y 30/00 438/597 |
| 2010/0028618 A1 * | 2/2010 | Gonska | B81B 7/02 428/188 |
| 2012/0256308 A1 * | 10/2012 | Helin | B81C 1/00333 257/E23.181 |
| 2014/0008738 A1 * | 1/2014 | Morris, III | B81B 7/02 438/51 |
| 2016/0060103 A1 * | 3/2016 | Hung | B81C 1/00238 438/51 |
| 2016/0244325 A1 * | 8/2016 | Cheng | B81C 1/00293 |
| 2016/0332867 A1 * | 11/2016 | Tseng | B81B 7/02 |

\* cited by examiner

*Primary Examiner* — Herve-Louis Y Assouman
(74) *Attorney, Agent, or Firm* — WPAT LAW; Anthony King

(57) ABSTRACT

The present disclosure provides a method for fabricating a semiconductor structure, including bonding a capping substrate over a sensing substrate, forming a through hole traversing the capping substrate, forming a dielectric layer over the capping substrate under a first vacuum level, and forming a metal layer over the dielectric layer under a second vacuum level, wherein the second vacuum level is higher than the first vacuum level.

20 Claims, 11 Drawing Sheets

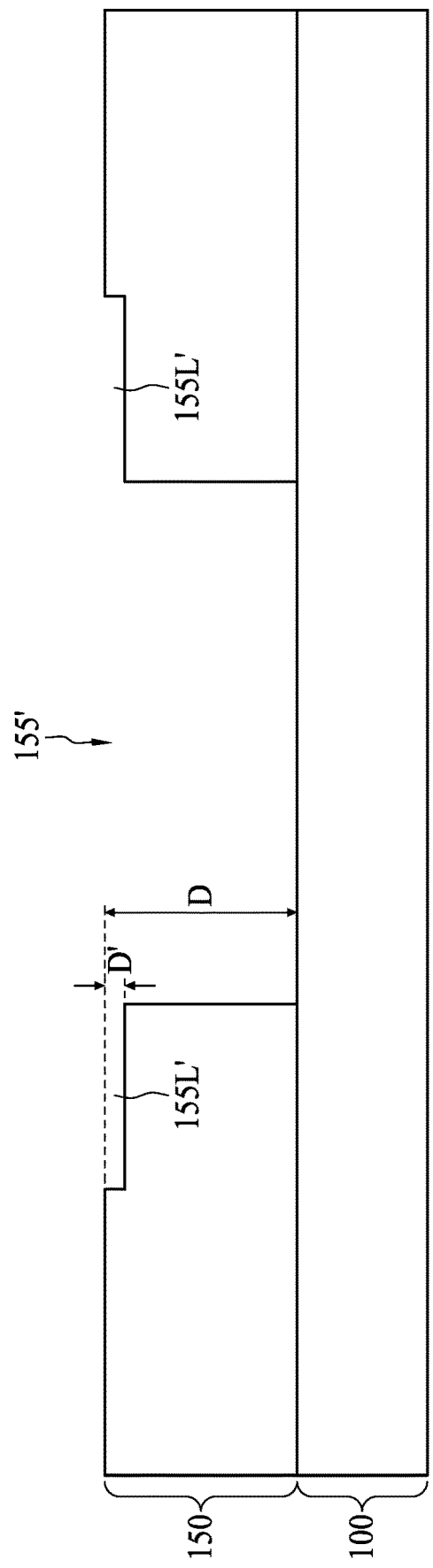

US 11,772,960 B2

METHOD OF FORMING DIELECTRIC AND METAL SEALING LAYERS ON CAPPING STRUCTURE OF A MEMS DEVICE

CROSS REFERENCE TO RELATED APPLICATIONS

This application claims the benefit of prior-filed U.S. non-provisional application Ser. No. 16/426,575 filed May 30, 2019.

BACKGROUND

Micro-electromechanical system (MEMs) devices, such as pressure sensors, gyroscopes, accelerometers, etc., are widely used in many modern day electronic devices. For example, MEMs accelerometers can be commonly found in mobile devices, automobiles (e.g. in airbag deployment systems), tablet computers, or consumer's devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5 to FIG. 10 are cross sectional views of a semiconductor structure during intermediate stages of manufacturing operations, according to some embodiments of the present disclosure.

DETAILED DESCRIPTION

Figure 1:
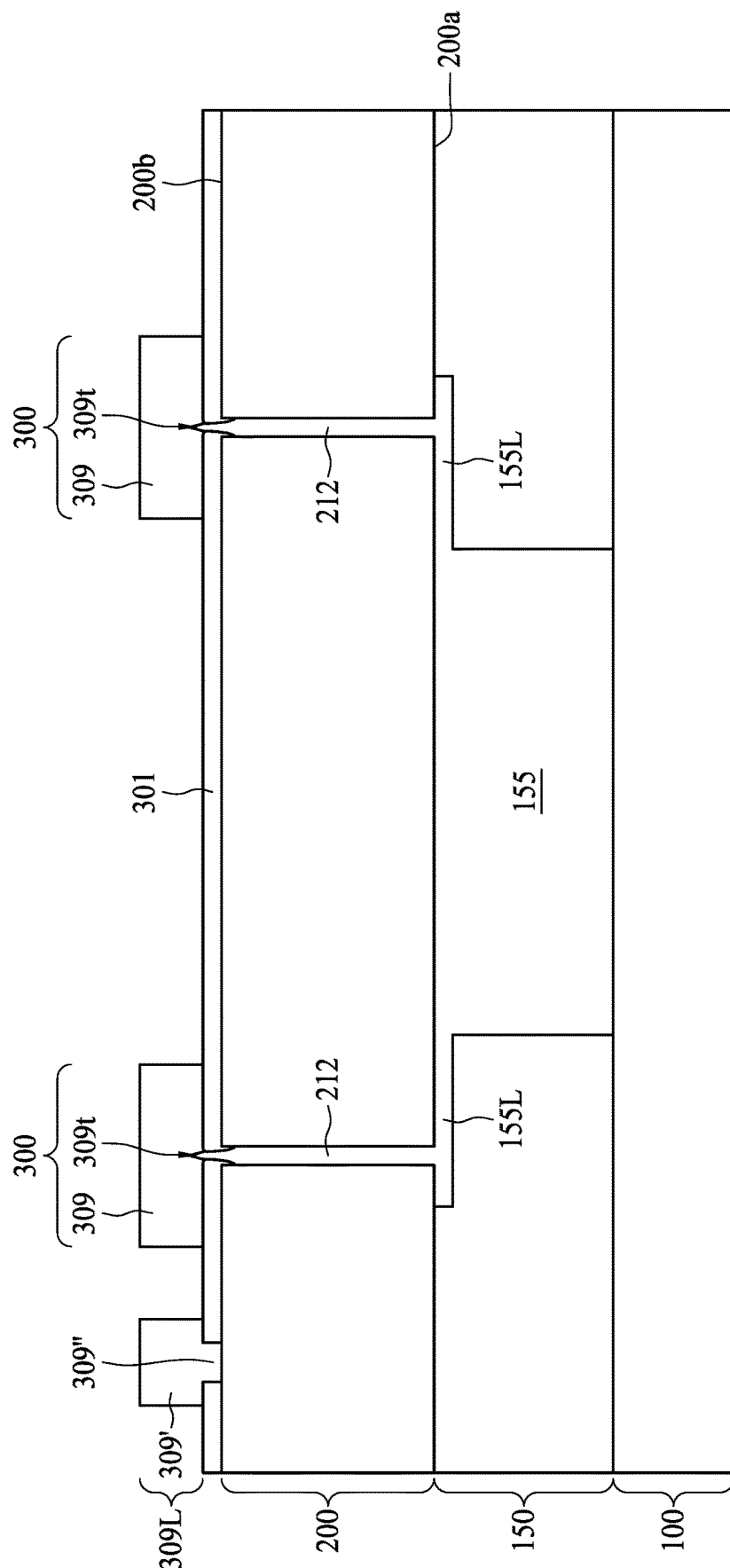
FIG. 1 is a cross sectional view of a semiconductor structure, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately," or "about" generally means within a value or range which can be contemplated by people having ordinary skill in the art. Alternatively, the terms "substantially," "approximately," or "about" means within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately," or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Multiple microelectromechanical system (MEMs) device may be integrated onto a same integrated chip in recent generations of MEMs integrated circuits. For example, pressure sensors are used to detect pressure, and motion sensors are used for motion-activated user interfaces in consumer electronics such as smartphones, tablets, gaming consoles, smart-TVs, and in automotive crash detection systems. Specifically, to capture a complete range of movements within a three-dimensional space, motion sensors often utilize an accelerometer and a gyroscope in combination. The accelerometer detects linear movement and the gyroscope detects angular movement. To meet consumer demand for low cost, high quality, and small device footprint, the accelerometer and the gyroscope can be formed from MEMS devices.

MEMs devices often operate in a manner that is dependent on an environment surrounding the device. For example, to measure an angular momentum, a MEMs vibrational gyroscope may measure an angular rate by utilizing the Coriolis Effect. To improve operation of a MEMs device, it may be desirable to operate the MEMs device within a surrounding environment that has a specific pressure that enables improved measurement of a desired parameter. For example, in the case of a MEMs vibrational gyroscope, a surrounding environment having a relatively low pressure (i.e., a higher vacuum) is desirable since it provides for a better measurement since it enhances displacement that is converted to a signal. Conversely, in the case of a MEMs accelerometer, a surrounding environment having a relatively higher pressure is desirable since it mitigates displacement due to background disturbances that are converted to noise. Therefore, MEMs devices typically entail a hermetically-sealed chamber that is held at a controlled pressure level that enables optimized operation of the device. The pressure level can range from a vacuum (e.g., 0.001 millibar or even lower) to a certain degree of pressure depending on a device type. In order to achieve a required reference pressure in a cavity of a device, sealing techniques can be performed to seal the cavity, wherein hermetical sealing is widely used. The cavity is opened by a through hole (which may be referred to as a vent hole in some cases) penetrating a substrate, and subsequently the cavity can be hermetically sealed by forming a sealing structure over the through hole. By setting the pressure of the operation chamber at a reference pressure, the cavity may approximately be hermitically sealed with the reference pressure.

A challenge with forming a MEMs structure with a reference pressure is the reliability of sealing structure. Specifically, due to the constraints of etching operation, it is arduous to decrease a critical dimension of an etched space to a certain extent. Moreover, this constraint is more severe when an aspect ratio (i.e., height-to-width ratio) increases. For example, when forming a through hole penetrating a substrate with a thickness more than 50 micron, it is difficult to scale down the critical dimension of the through hole to be under 1 micron. As a result, it is more difficult to form a sealing structure overhanging the through hole with the aforesaid critical dimension. Seams or micro leak paths may be induced at the merged interface of the sealing structure, which may result in vacuum leakage and thereby causing the pressure of the cavity deviated from a desired reference pressure. Prolonging the duration of sealing structure formation may decrease the occurrence of seams at the merged interface, however, formation of the sealing structure is often conducted under elevated temperature, which can be an adverse factor to the MEMs structure formed prior to the formation of the sealing structure.

The present disclosure provides a semiconductor structure and a method for fabricating a semiconductor structure to improve the reliability of the sealing structure, and alleviate the risk of causing cavity pressure change due to vacuum leakage.

Referring to FIG. 1, FIG. 1 is a cross sectional view of a semiconductor structure, according to some embodiments of the present disclosure. A spacer 150 is disposed over a sensing substrate 100, and a capping substrate 200 is disposed over the spacer 150. The sensing substrate 100 may be a device substrate including device region or semiconductor devices, such as micro-electromechanical systems (MEMs) devices. For example, the devices may include gyroscope (e.g. vibrating gyroscope or piezoelectric plate gyroscope), accelerometer, motion sensor, pressure sensor, and/or the like. In some embodiments, the sensing substrate 100 is a p-type semiconductor substrate (P-Substrate) or an n-type semiconductor substrate (N-Substrate) comprising silicon. In some other alternative embodiments, the sensing substrate 100 includes other elementary semiconductor, such as germanium; a compound semiconductor including silicon carbide, gallium arsenic, gallium phosphide, indium phosphide, indium arsenide, and/or indium antimonide; an alloy semiconductor including silicon germanium (SiGe), gallium arsenide phosphide (GaAsP), aluminum indium arsenide (AlInAs), aluminum gallium arsenide (AlGaAs), indium gallium arsenide (InGaAs), indium gallium phosphide (InGaP), indium gallium arsenide phosphide (InGaAsP), combinations thereof, or the like. In some other embodiments, the sensing substrate 100 is a semiconductor on insulator (SOI). In some other embodiments, the sensing substrate 100 may include a doped epitaxial layer, a gradient semiconductor layer, and/or a semiconductor layer overlying another different type semiconductor layer, such as a silicon layer on a silicon germanium layer. The sensing substrate 100 may or may not include doped regions, such as a p-well, an n-well, or combination thereof.

A cavity 155 is between the capping substrate 200 and the sensing substrate 100, and is surrounded by the spacer 150. That is, the cavity 155 is a space surrounded by the spacer 150, the sensing substrate 100 and the capping substrate 200. In some alternative embodiments, a portion of the cavity 155 is surrounded by the capping substrate 200. In some alternative embodiments, the cavity 155 includes recess or chamber formed in the capping substrate 150.

The capping substrate 200 further includes a through hole 212 extending from a first surface 200a to a second surface 200b of the capping substrate 200, wherein the first surface 200a faces toward the sensing substrate 100 and the second surface 200b is opposite to the first surface 200a. The cavity 155 further connects with the through hole 212, in other words, the cavity 155 and the through hole 212 form a continuous space. Optionally in some embodiments, the spacer 150 includes a channel 155L laterally extending from the cavity 155, and connecting between the cavity 155 and the through hole 212. A dielectric layer 301 is disposed above second surface 200b of the capping substrate 200. The dielectric layer 301 may include silicon oxide, silicon nitride, or other suitable dielectric material. Specifically, a thickness or a profile of such suitable dielectric material is relatively easier to be controlled during fabrication operations comparing to metal formation operations.

A sealing structure 300 is disposed at the second surface 200b of the capping substrate 200. The sealing structure 300 includes at least a portion of the dielectric layer 301 and at least a portion of the metal layer 309L above the dielectric layer 301. In some embodiments, the sealing structure 300 is aligned with the through hole 212. The sealing structure 300 has a metal sealing 309 of the metal layer 309L and a portion of the dielectric layer 301 directly above the through hole 212. With the aid of the sealing structure 300, the cavity 155 can be maintained under a reference pressure different from an atmospheric pressure or an ambient pressure. The details of the sealing structure 300 and the through hole 212 will be subsequently discussed in FIG. 3.

Figure 2:
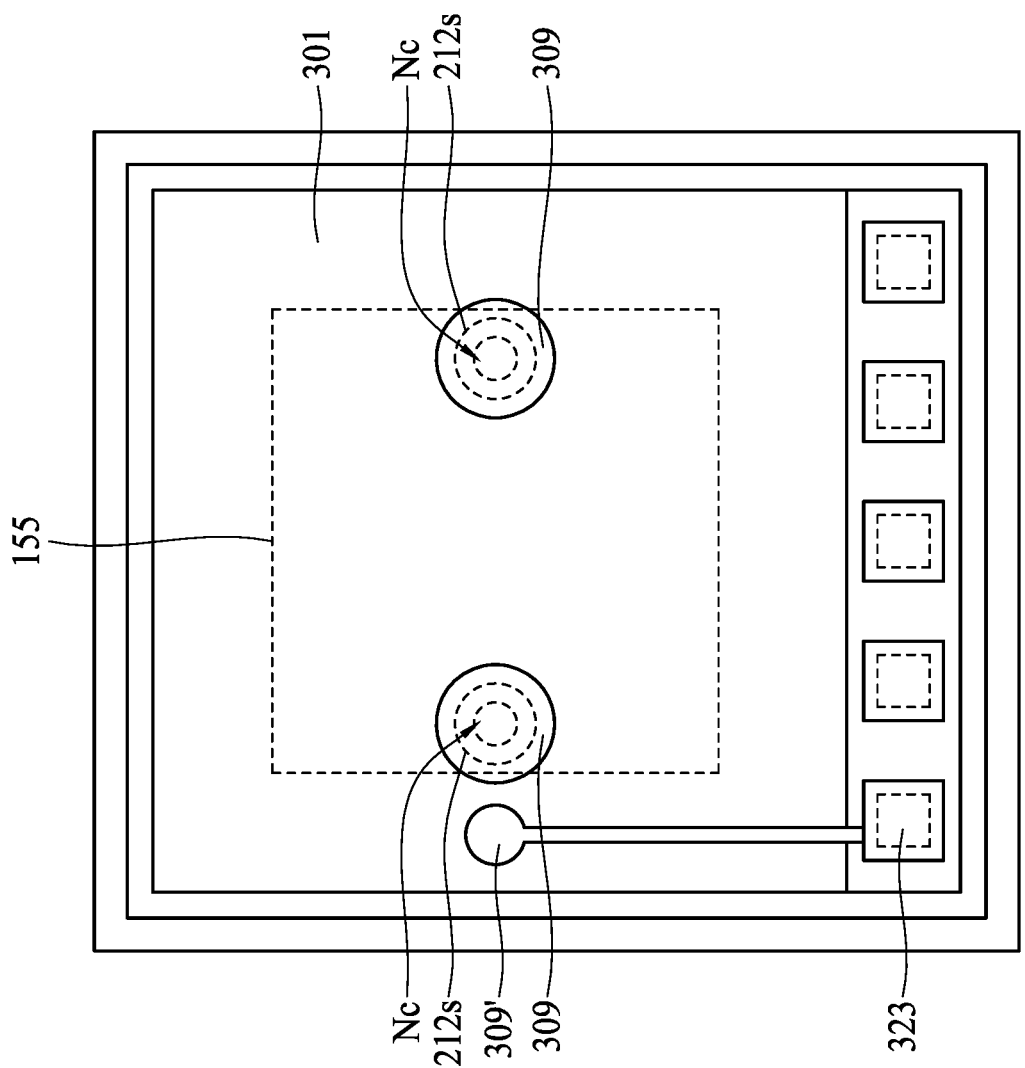
FIG. 2 is a top view perspective of a semiconductor structure, according to some embodiments of the present disclosure.

Referring to FIG. 1 and FIG. 2, FIG. 2 is a top view perspective of a semiconductor structure, according to some embodiments of the present disclosure. In some embodiments, the metal sealing 309 may have a round shape (such as circular or ellipse) from a top view perspective. The metal sealing 309 is directly above the cavity 155 or the channel 155L laterally extending from the cavity 155. In some embodiments, the metal layer 309L further include a metal routing 309' above the second surface 200b of the capping substrate 200. The metal routing 309' includes a penetrating portion 309" penetrating the dielectric layer 301 and directly contacting the second surface 200b of the capping substrate 200. The metal routing 309' may be electrically connected to metal lines or devices (not shown in FIG. 1 or FIG. 2) in the capping substrate 200 and/or a bonding pad 323 exposing from the second surface 200b of the capping substrate 200 (or the dielectric layer 301) as shown in FIG. 2. In some embodiments, the metal routing 309' levels with the metal sealing 309. Alternatively stated, the metal layer 309L may have a substantially coplanar top surface. In some embodiments, a material of the metal layer 309L may include copper (Cu), aluminum (Al), titanium (Ti), titanium tungsten (TiW), Tungsten (W), other suitable conductive material (such as metal or metal composition), the combination thereof, or the like. In some embodiments, an area of the portion of the metal routing 309' above the dielectric layer 301 is greater than an area of the penetrating portion 309".

Figure 3:
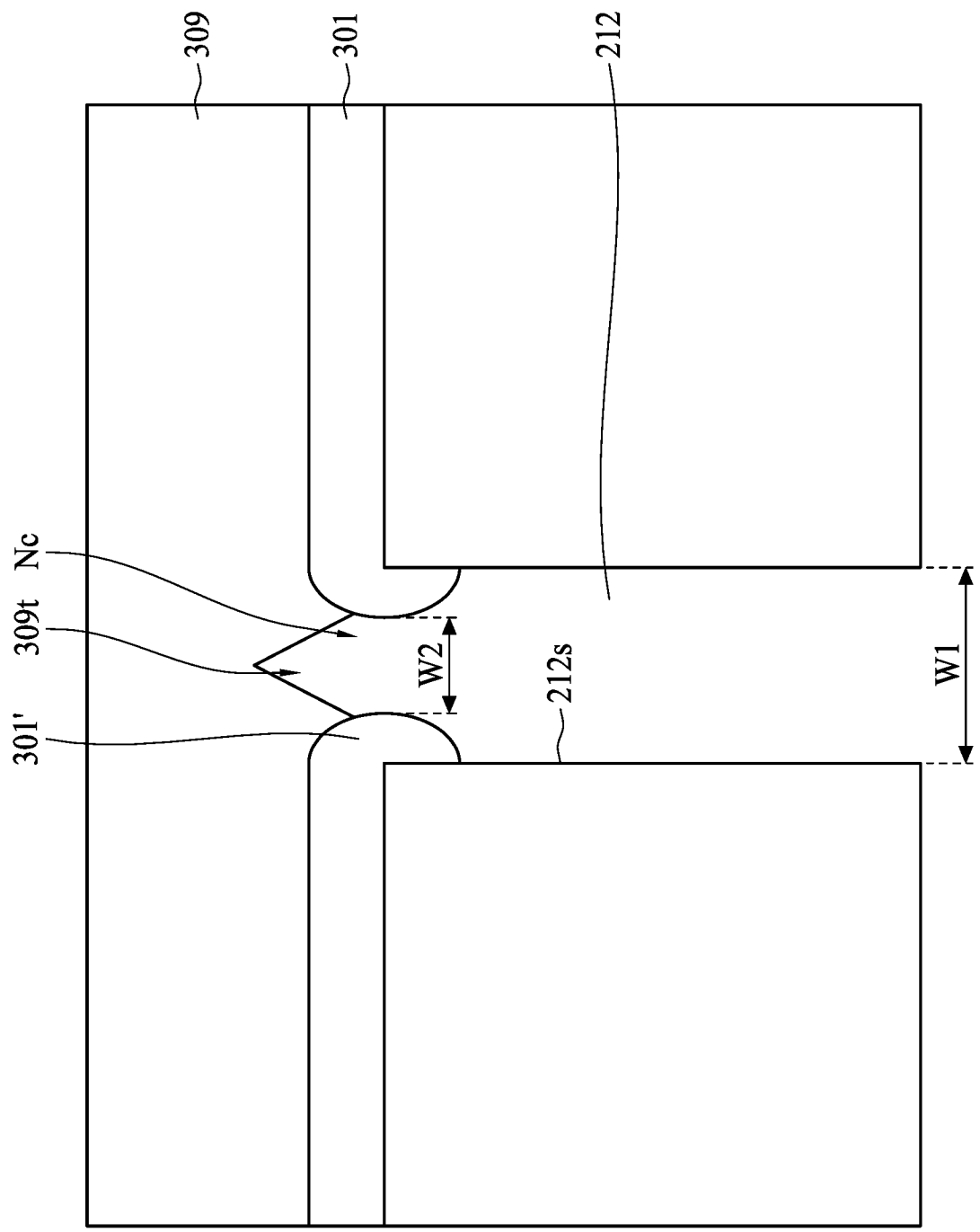
FIG. 3 is an enlarged cross sectional view of a through hole, a capping substrate, a dielectric layer, and a sealing structure, according to some embodiments of the present disclosure.

Referring to FIG. 1, FIG. 2 and FIG. 3, FIG. 3 is an enlarged cross sectional view of a through hole, a capping substrate, a dielectric layer, and a sealing structure, according to some embodiments of the present disclosure. A portion of the dielectric layer 301 is between the second surface 200b and the first surface 200a of the capping substrate 200, and contacts with a sidewall 212s of the through hole 212. The sealing structure 300 has a necking portion Nc in proximity to the second surface 200b of the capping substrate 200, and the metal sealing 309 covers the necking portion Nc. The necking portion Nc is surrounded by the dielectric layer 301, and an opening of the necking portion Nc has a dimension W2. By contrast, a width W1 (which can be measured at the first surface 200a) of the through hole 212 is greater than the dimension W2 of the necking portion Nc. From an alternative aspect, the through hole 212 can be deemed to have a necking portion surrounded by the dielectric layer 301, wherein the dielectric layer 301 decreases a critical dimension of the through hole 212. As previously discussed, the width W1 of the through hole 212 may be greater than 1 micron due to the limitation of etching operation applied on a relatively thicker substrate (in some embodiments greater than 50 micron or greater than 100 micron). In some embodiments, a narrowest part of the necking portion Nc may be above the second surface 200b. In some other embodiments, a narrowest part of the necking portion Nc may be between the second surface 200b and the first surface 200a of the capping substrate 200. In some other embodiments, narrowest part of the necking portion Nc may be at the second surface 200b.

In some embodiments, the dimension W2 of the necking portion Nc is less than 0.8 micron. In some other embodiments, the dimension W2 of the necking portion Nc is at least 20% less than the width W1 of the through hole 212. For example, if a width W1 of the through hole 212 is about 1 micron, the dimension W2 of the necking portion Nc is less than 0.8 micron.

In some embodiments, a thickness of a portion of the metal sealing 309 directly above the through hole 212 is less than a thickness of the metal sealing 309 at a peripheral area directly above the capping substrate 200. In some embodiments, the metal sealing 309 has a recess 309t directly above and faces the through hole 212, wherein the recess 309t extends away from the capping substrate 200. In some embodiments, the recess 309t has a tapered shape tapering away from the capping substrate 200. The recess 309t can be a reference location of the coalescence of the metal sealing 309.

Figure 4A:
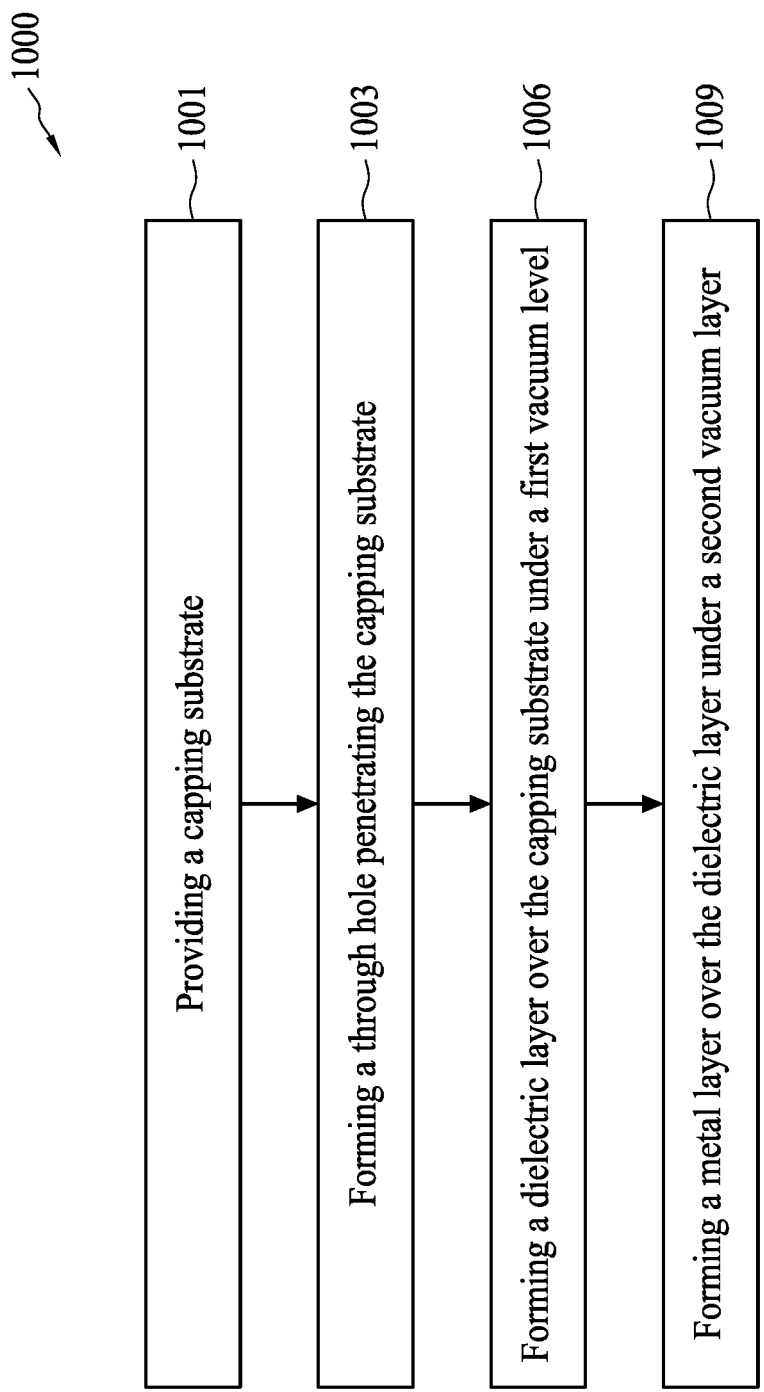
FIG. 4A shows a flow chart representing a method for fabricating a semiconductor structure, in accordance with some embodiments of the present disclosure.

Referring to FIG. 4A, FIG. 4A shows a flow chart representing method of fabricating a semiconductor structure, in accordance with some embodiments of the present disclosure. The method 1000 for fabricating a semiconductor structure includes providing a capping substrate (operation 1001, which can be referred to FIG. 5), forming a through hole penetrating the capping substrate (operation 1003, which can be referred to FIG. 7), forming a dielectric layer over the capping substrate under a first vacuum level (operation 1006, which can be referred to FIG. 8), and forming a metal layer over the dielectric layer under a second vacuum layer (operation 1009, which can be referred to FIG. 10).

Figure 4B:
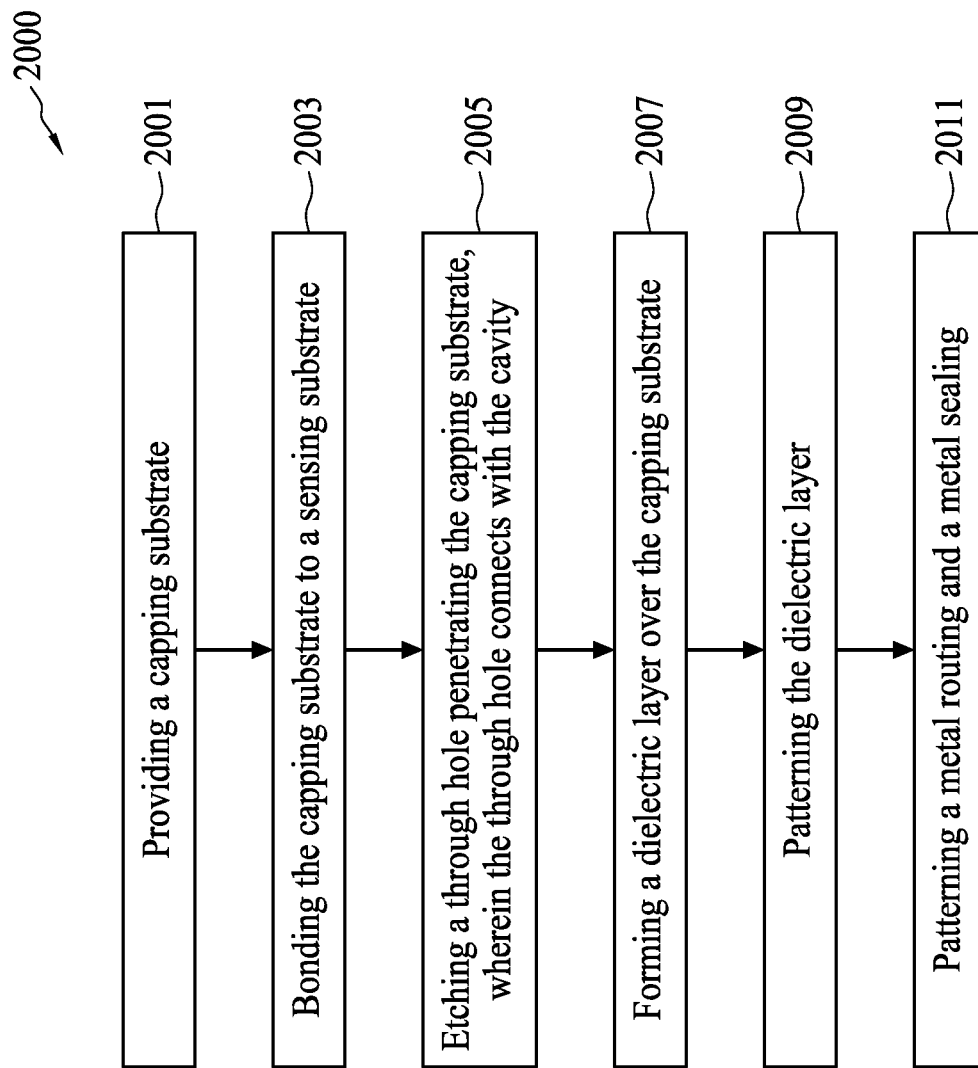
FIG. 4B shows a flow chart representing a method for fabricating a semiconductor structure, in accordance with some embodiments of the present disclosure.

Referring to FIG. 4B, FIG. 4B shows a flow chart representing a method for fabricating a semiconductor structure, in accordance with some embodiments of the present disclosure. The method 2000 for fabricating a semiconductor structure includes providing a capping substrate (operation 2001, which can be referred to FIG. 5), bonding the capping substrate to a sensing substrate (operation 2003, which can be referred to FIG. 6), etching a through hole penetrating the capping substrate, wherein the through hole connects with the cavity (operation 2005, which can be referred to FIG. 7), forming a dielectric layer over the capping substrate (operation 2007, which can be referred to FIG. 8), patterning the dielectric layer (operation 2009, which can be referred to FIG. 9), and patterning a metal routing and a metal sealing (operation 2011, which can be referred to FIG. 10).

Referring to FIG. 5, FIG. 5 is a cross sectional view of a semiconductor structure during intermediate stages of manufacturing operations, according to some embodiments of the present disclosure. A sensing substrate 100 is provided. A semiconductor device may be formed on the sensing substrate 100, for example, gyroscope (e.g. vibrating gyroscope or piezoelectric plate gyroscope), accelerometer, motion sensor, pressure sensor, and/or the like. A spacer 150 and a recess 155' are subsequently formed above the sensing substrate 100. In some embodiments, a spacer layer is formed on the sensing substrate 100 by depositing a dielectric layer. In some other embodiments, the spacer 150 is bonded or adhered to the sensing substrate 100. In some embodiments, the recess 155' is formed by etching operation, photolithography operations, or other suitable material removal operation applied to the spacer layer. In some alternative embodiments, a sacrificial layer (not shown in FIG. 5) is used to define a position of the recess 155' during the forming of the spacer 150. Furthermore, a secondary recess 155L' adjacent to and laterally extending from the recess 155' is optionally formed. A depth D' of the secondary recess 155L' is less than a depth D of the recess 155'.

Figure 6:
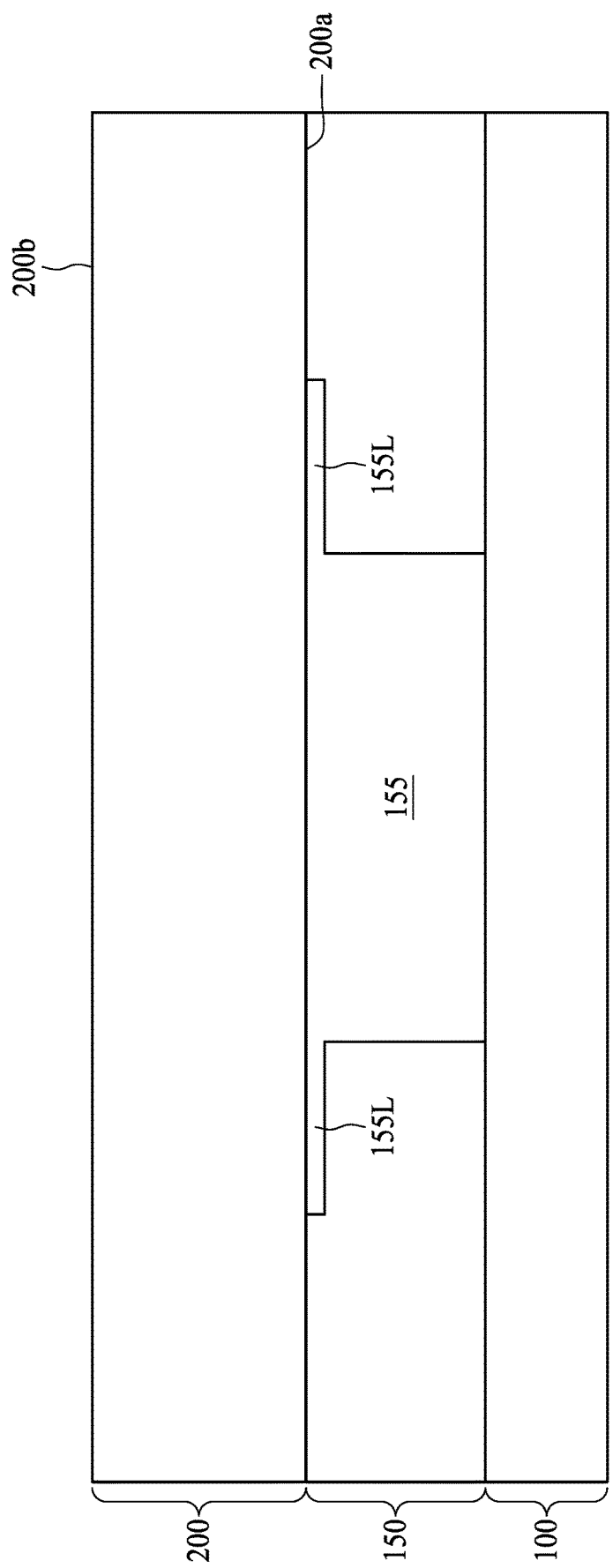

Referring to FIG. 6, FIG. 6 is a cross sectional view of a semiconductor structure during intermediate stages of manufacturing operations, according to some embodiments of the present disclosure. Subsequently, the capping substrate 200 is bonded to the sensing substrate 100 through the spacer 150, wherein the first surface 200a of the capping substrate 200 faces the spacer 150. The recess 155' is surrounded by the spacer 150, the capping substrate 200 and the sensing substrate 100 and thereby the cavity 155 is formed. If the secondary recess 155L' has been formed, the channel 155L laterally extending from the cavity 155 is also thereby formed between the spacer 150 and the capping substrate 200.

Figure 7:
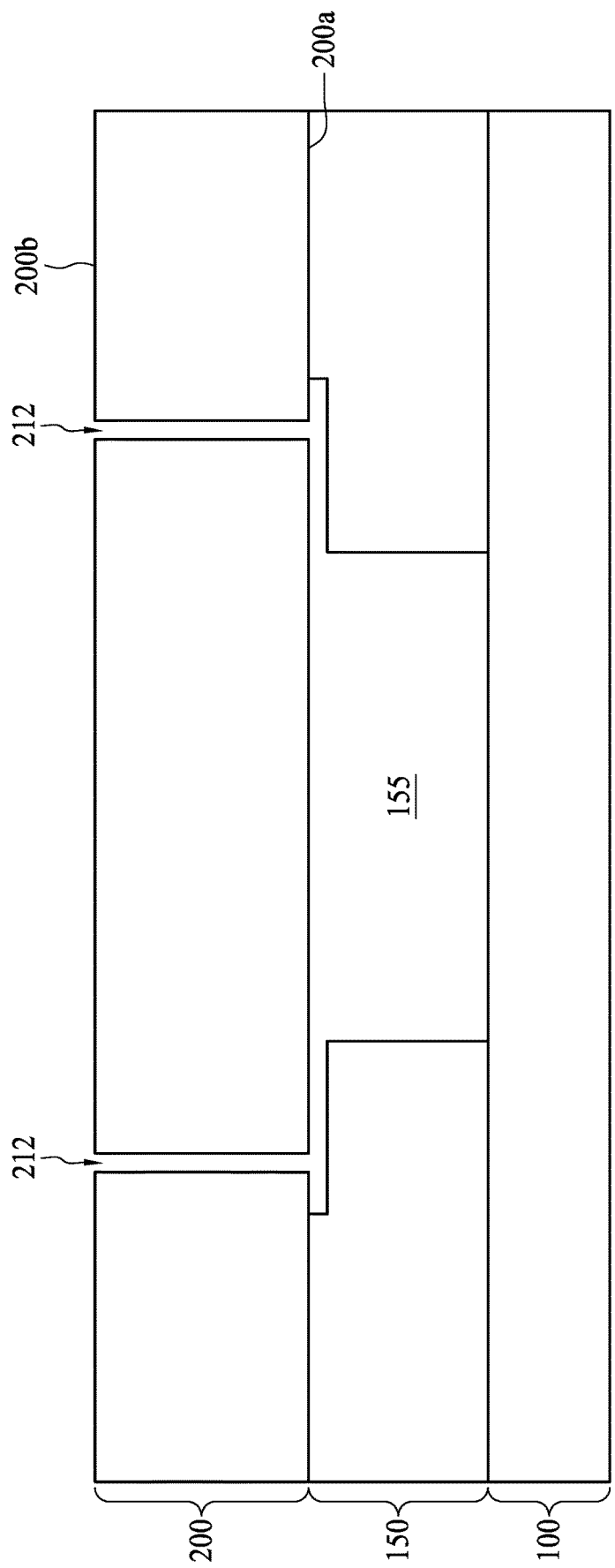

Referring to FIG. 7, FIG. 7 is a cross sectional view of a semiconductor structure during intermediate stages of manufacturing operations, according to some embodiments of the present disclosure. Subsequently a through hole 212 in the capping substrate 200, connecting from the first surface 200a and the second surface 200b, is formed. The through hole 212 is connected to the cavity 155 (or to the channel 155L in some embodiments). In some embodiments, the through hole 212 is formed by etching operation (e.g. wet etching). It should be noted that, as previously discussed, due to the constraints of etching operation, it is arduous to decrease a critical dimension to height ratio of an etched space to a certain extent. For example, if the capping substrate 200 has a thickness more than 50 micron, it is difficult to form a through hole with a width less than 1 micron with a desirable yield rate.

Figure 8:
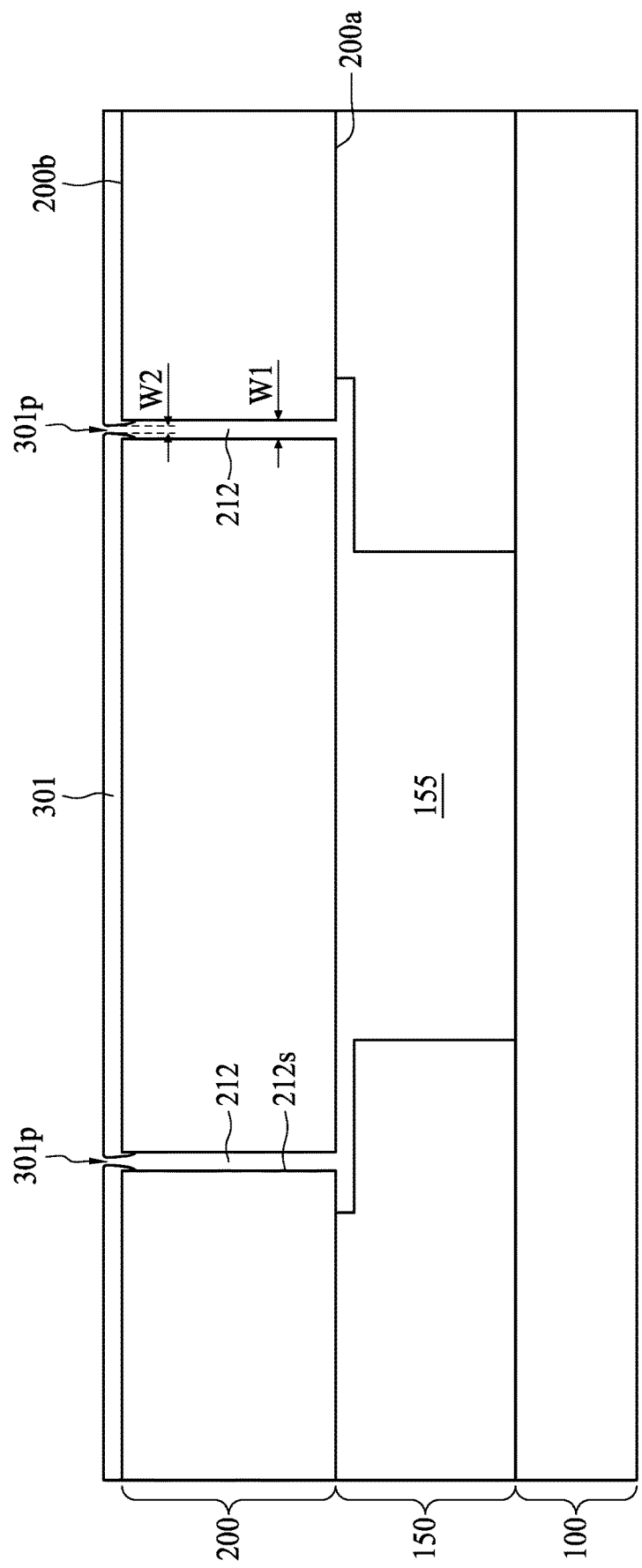

Referring to FIG. 8, FIG. 8 is a cross sectional view of a semiconductor structure during intermediate stages of manufacturing operations, according to some embodiments of the present disclosure. As previously discussed in FIG. 1, FIG. 2 and FIG. 3, the dielectric layer 301 is disposed above the second surface 200b of the capping substrate 200 to reduce a critical dimension of the through hole 212. The dielectric layer 301 is formed by blanket deposition under a first vacuum level, for example, from about 0.2 Torr to about 0.5 Torr. The dielectric layer 301 is formed under a controlled manner such that an opening 301p is formed above the though hole 212 after the completion of the dielectric layer 301 formation. As shown in FIG. 3, a portion of the dielectric layer 301 is formed on the sidewall 212s of the through hole 212, and such portion is between the second surface 200b and the first surface 200a of the capping substrate 200. The opening 301p has a dimension W2 and the through hole 212 has a width W1 (which can be measured at the first surface 200a proximal to the spacer 150) greater than the dimension W2. In some embodiments, the dimension W2 is less than 0.8 micron. In some other embodiments, the dimension W2 is at least 20% less than the width W1 of the through hole 212. For example, if the width W1 of the through hole 212 is about 1 micron, the dimension W2 of the necking portion Nc is less than 0.8 micron.

In order to alleviate leakage and control a critical dimension of the opening 301p with an improved precision, a material of the dielectric layer 301 includes dielectric material with adequate sealing effect (i.e. lower air permeability) and entailing a blanket deposition technique where controlling a thickness thereof is less arduous. For example, silicon oxide ($SiO_2$) and/or silicon nitride (SiN) may be suitable material of the dielectric layer 301. By monitoring duration of the deposition operation, the accuracy of controlling a thickness of the silicon oxide ($SiO_2$) and/or silicon nitride (SiN) and a critical dimension of the opening 301p can be improved. In some embodiments, the material of the dielectric layer 301 may be a passivation layer, which may alleviate the affect applied on capping substrate 200 from external environment (such as moisture).

It should be noted that in a comparative embodiment, when a through hole is entirely covered by a dielectric layer, the pressure level in the cavity 155 is hold at the first vacuum level. However, in order to reach vacuum level higher than the first vacuum level in the cavity, current embodiment may not cover the entire through hole with the dielectric layer under the first vacuum level but remain an opening 301p in the dielectric layer 301. In some embodiments, the opening 301p will be further covered by a metal sealing 309 (as will be subsequently discussed in FIG. 10) under a second vacuum level, for example, from about 0.004 Torr to about 0.005 Torr, higher than the first vacuum level in order to reach the desired vacuum level in the cavity. Thus, in order to form the opening 301p in the dielectric layer 301 during the blanket deposition operation, the duration of the deposition operation is controlled, and the deposition operation is terminated before the dielectric layer 301 is merged over the through hole 212.

Figure 9:
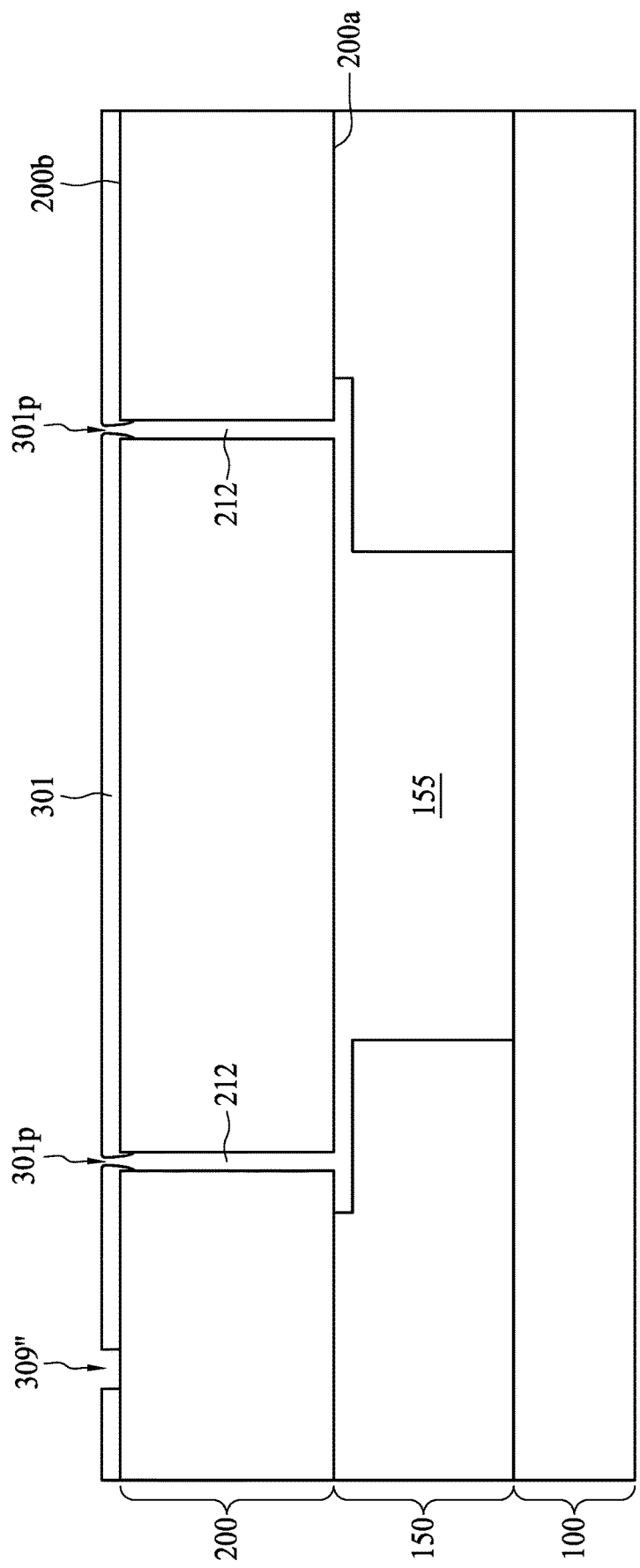

Referring to FIG. 9, FIG. 9 is a cross sectional view of a semiconductor structure during intermediate stages of manufacturing operations, according to some embodiments of the present disclosure. Subsequently the dielectric layer 301 is patterned to expose a portion of the capping substrate 200. In some embodiments, a conductive feature, such as metal line or interconnect structure (not shown in FIG. 9), may be exposed from the dielectric layer 301, so that the conductive feature can be electrically connected to a bonding pad 323 (shown in FIG. 2) through a metal routing 309' (shown in FIG. 2 and FIG. 10, which will be subsequently discussed).

Figure 10:
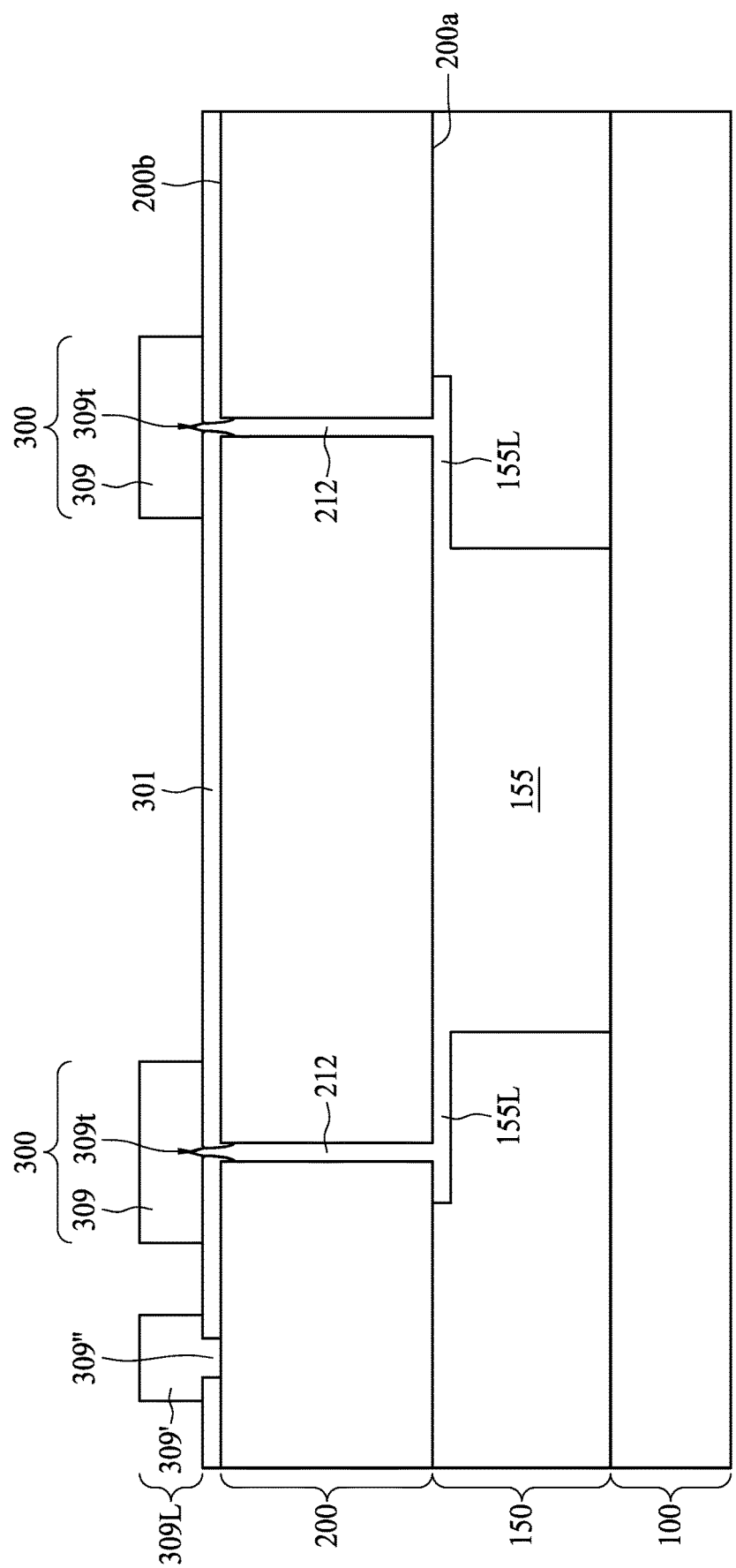

Referring to FIG. 10, FIG. 10 is a cross sectional view of a semiconductor structure during intermediate stages of manufacturing operations, according to some embodiments of the present disclosure. A metal layer 309L is formed and patterned over the dielectric layer 301. In some embodiments, the forming of the metal layer 309L is performed under a second vacuum level higher than the first vacuum level (i.e., the pressure at the second vacuum level is lower than the pressure at the first vacuum level). In some embodiments, the semiconductor structure is transferred from a first chamber for dielectric layer deposition to a second chamber for metal deposition. As previously discussed, the vacuum level in the first chamber is lower than the vacuum level in the second chamber during material deposition, having the semiconductor structure illustrated in FIG. 10 enter the second chamber allows the cavity 155 to possess a pressure level lower than that in the first chamber. In some embodiments, a material of the metal layer 309L may include copper (Cu), aluminum (Al), titanium (Ti), titanium tungsten (TiW), Tungsten (W), other suitable conductive material which can provide an greater sealing effect (lower air permeability). Specifically, due to the opening 301p previously formed in the dielectric layer 301, a portion of the metal layer 309L (which would be a part of the metal sealing 309 after patterning) is overhung above the opening 301p. Therefore after merging the metal layer 309L above the opening 301p from the peripheral area of the opening 301p, a thickness of a portion of the metal sealing 309 directly above the through hole 212 is less than a thickness of the metal sealing 309 at a peripheral area directly above the capping substrate 200. In some embodiments, the metal sealing 309 has a recess 309t directly above and faces the through hole 212, wherein the recess 309t extends away from the capping substrate 200. In some embodiments, the recess 309t has a tapered shape tapering away from the capping substrate 200.

In a comparative embodiments, a metal layer is directly disposed above the capping substrate without forming a dielectric layer prior to forming the metal layer. Since the dimension of the opening of a through hole may be greater than 1 micron, it may take longer duration to merge the metal layer above the through hole, and an area of the metal layer overhanging above the through hole is also relatively greater. As a result, the difficulty of merging the metal layer above the through hole is increased, and the reliability of the sealing structure subsequently formed by patterning the metal layer may be decreased. Specifically, a recess or a crack in the metal layer directly above the through hole may have a greater depth and/or a greater width, which may increase the risk of inducing leakage.

After patterning the metal layer 309L, the metal sealing 309 and the metal routing 309' are formed above the capping substrate 200. The metal routing 309' penetrates the dielectric layer 301 and contact with the exposed portion of the capping substrate 200 from the dielectric layer 301, which allows the conductive feature to be electrically connected to a bonding pad 323 (shown in FIG. 2). The metal sealing 309 is formed directly above the through hole 212 by patterning the metal layer 309L. In some of the embodiments, in order to facilitate the efficiency of fabrication operations, the metal routing 309' and the metal sealing 309 are obtained by patterning the metal layer 309L with a same mask within a single lithography operation, wherein the metal routing 309' levels with the metal sealing 309. Alternatively stated, the metal layer 309L may have a substantially coplanar top surface.

The present disclosure provides a semiconductor structure with a dielectric layer 301 between the metal sealing 309 and the capping substrate 200. Specifically, due to the constraints of etching operation, it is arduous to decrease a critical dimension to height ratio of an etched space to a certain extent. For example, when forming a through hole penetrating a substrate with a thickness more than 50 micron, it is difficult to scale down the critical dimension of the through hole to be under 1 micron. The dielectric layer 301 is formed in order to decrease a dimension of an opening at the second surface 200b of the capping substrate 200, thus the duration of merging the metal layer 309L above the through hole 212 may be decreased, and an area of the metal layer 309L overhanging above the through hole 212 may also be decreased. As a result, the reliability of the sealing structure 300 subsequently formed by patterning the metal layer 300L may be improved. Specifically, a recess or a crack in the metal layer directly above the through hole may have a less depth and/or a less width, which may alleviate the risk of leakage and improve the reliability. In some embodiments, oxide ($SiO_2$) and/or silicon nitride (SiN) may be suitable material of the dielectric layer 301. By monitoring duration of the deposition operation, the accuracy of controlling a thickness of the silicon oxide ($SiO_2$) and/or silicon nitride (SiN) and a critical dimension of the opening 301p can be improved.

Some embodiments of the present disclosure provide a semiconductor structure, including a sensing substrate, a capping substrate over the sensing substrate, the capping substrate having a first surface facing toward the sensing substrate and a second surface facing away from the sensing substrate, wherein the capping substrate comprises a through hole extending from the first surface to the second surface, a spacer between the sensing substrate and the capping substrate, the spacer, the sensing substrate, and the capping substrate forming a cavity connecting with the through hole, and a sealing structure at the second surface and aligning with the through hole, wherein the sealing structure comprises a metal layer and a dielectric layer.

Some embodiments of the present disclosure provide a micro electro mechanical system (MEMS) structure, including a vacuum cavity surrounded by a sensing substrate, a capping substrate, and a spacer between the sensing substrate and the capping substrate, a through hole in the capping substrate, connecting to the vacuum cavity, the through hole includes: a necking portion surrounded by a dielectric layer, the necking portion comprises a dimension less than a width of the through hole, and a metal sealing over the through hole.

Some embodiments of the present disclosure provide a method for fabricating a semiconductor structure, including providing a capping substrate, forming a through hole penetrating the capping substrate, forming a dielectric layer over the capping substrate under a first vacuum level, and forming a metal layer over the dielectric layer under a second vacuum level, wherein the second vacuum level is higher than the first vacuum level.

The foregoing outlines features of several embodiments so that those skilled in the art may better understand the aspects of the present disclosure. Those skilled in the art should appreciate that they may readily use the present disclosure as a basis for designing or modifying other operations and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for fabricating a semiconductor structure, comprising:
   bonding a capping substrate over a sensing substrate;
   forming a through hole traversing the capping substrate;
   forming a dielectric layer over the capping substrate under a first vacuum level, wherein forming the dielectric layer comprises: blanket depositing the dielectric layer over the capping substrate and a sidewall of the through hole, and forming a through aperture having a dimension less than a width of the through hole, wherein the through aperture penetrates through the dielectric layer; and
   forming a metal layer over the dielectric layer under a second vacuum level, wherein the second vacuum level is higher than the first vacuum level.

2. The method of claim 1, further comprising patterning the dielectric layer to expose a portion of the capping substrate prior to forming the metal layer.

3. The method of claim 2, wherein forming the metal layer comprises patterning the metal layer to form a metal routing contacting with the exposed portion of the capping substrate and a metal sealing aligning with the through hole.

4. The method of claim 3, wherein blanket depositing the dielectric layer over the sidewall of the through hole comprises terminating the depositing prior to merging of the dielectric layer.

5. The method of claim 3, wherein the metal routing and the metal sealing are patterned by a first mask.

6. The method of claim 1, wherein a lowermost surface of the dielectric layer is above a bottom of the through hole.

7. A method for fabricating a semiconductor structure, comprising:
   disposing a capping substrate over a sensing substrate;
   forming a through hole traversing the capping substrate;
   forming a dielectric layer over a top surface of the capping substrate, wherein the dielectric layer comprises a through aperture that penetrates the dielectric layer, and the through aperture overlaps with the through hole in a vertical direction; and
   forming a metal sealing to cover the through aperture.

8. The method of claim 7, wherein forming the metal sealing comprises:
    forming a first portion of the metal sealing at a peripheral area; and
    forming a second portion of the metal sealing overhanging directly above the through aperture.

9. The method of claim 8, wherein the first portion is thicker than the second portion.

10. The method of claim 8, wherein the second portion comprises a recess over the through aperture.

11. The method of claim 7, further comprising forming a metal routing layer over the dielectric layer simultaneously with the formation of the metal sealing.

12. The method of claim 7, wherein a lower portion of the through hole is exposed from the dielectric layer.

13. A method for fabricating a semiconductor structure, comprising:
    bonding a first substrate to a second substrate, the first substrate comprises a top surface facing away from the second substrate;
    forming a through hole traversing the first substrate, wherein a top portion of the through hole has a first cross sectional area at the top surface of the first substrate;
    forming a dielectric layer over an inner sidewall of the top portion of the through hole to form a through aperture by a deposition operation, wherein a lower portion of the through hole is free from being covered by the dielectric layer;
    terminating the deposition operation when a second cross sectional area of the through aperture is less than the first cross sectional area; and
    forming a metal sealing to cover the through aperture.

14. The method of claim 13, wherein the dielectric layer further covers a top surface of the first substrate.

15. The method of claim 13, wherein the through aperture has a second width less than a first width of the through hole.

16. The method of claim 15, wherein the second width is less than 0.8 micron.

17. The method of claim 15, wherein the second width is at least 20% less than the first width.

18. The method of claim 13, further comprising altering an environment vacuum level prior to forming the metal sealing.

19. The method of claim 13, wherein the dielectric layer comprises at least one of the silicon oxide or silicon nitride.

20. The method of claim 13, wherein forming the metal sealing comprises: forming a metal material layer from a peripheral area of the through aperture extending toward a position directly above the through aperture.

* * * * *